United States Patent
Gold et al.

(10) Patent No.: US 6,594,194 B2
(45) Date of Patent: Jul. 15, 2003

(54) MEMORY ARRAY WITH COMMON WORD LINE

(75) Inventors: Spencer M. Gold, Pepperell, MA (US); Joseph R. Siegel, Shrewsbury, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/902,914

(22) Filed: Jul. 11, 2001

(65) Prior Publication Data

US 2003/0012072 A1 Jan. 16, 2003

(51) Int. Cl.[7] .................................................. G11C 8/00
(52) U.S. Cl. .............................. 365/230.03; 365/189.05; 365/230.05
(58) Field of Search ........................ 365/230.03, 230.05, 365/189.05

(56) References Cited

U.S. PATENT DOCUMENTS 5,241,510 A  *  8/1993 Kobayashi et al. .... 365/189.03
5,317,537 A  *  5/1994 Shinagawa et al. .... 365/189.04
5,475,644 A  * 12/1995 Chauvel et al. ........ 365/189.02
6,301,174 B1 * 10/2001 Chung ......................... 365/154

* cited by examiner

*Primary Examiner*—Hoai Ho
(74) *Attorney, Agent, or Firm*—Lahive & Cockfield, LLP

(57) ABSTRACT

The present invention provides logic to write data to a multi-ported memory array. The memory array is comprised of a plurality of memory banks and a common write word line shared by the memory banks. The memory array includes a plurality of write buffers, wherein each write buffer is associated with one of the memory banks. The memory array further comprises a selector module for selecting a write buffer to write data into its associated memory bank. The memory array further includes a writing module within the write buffer for writing data into the selected memory bank by way of a signal to the memory bank.

14 Claims, 3 Drawing Sheets

MEMORY ARRAY WITH COMMON WORD LINE

FIELD OF THE INVENTION

The present invention relates generally to writing data to a banked memory array and more particular to a technique for banking multi-ported register file structures with a common write line.

BACKGROUND OF THE INVENTION

Multi-ported register file memory arrays are typically large structures because each port requires its own set of word and bit lines. Moreover, each set of word lines requires its own decoder and driver, while each set of bit lines requires its own driver and/or sense amplifier. As the number of ports increase, these requirements become more burdensome.

This problem is further exaggerated when it is necessary to bank the register file memory array. Reading from the banked memory array does not pose a significant problem. A common read word line may connect to the banks of the memory array, and a column multiplexer on the bit lines. This configuration allows the common read word line to be asserted without causing a conflict. Writing to the banked memory array, however, poses more of a problem. A shared memory word line poses a problem in that data will be written into multiple banks, which cannot be allowed. This condition cannot be resolved with a column multiplexer either. One solution is to add a second set of write word lines to the array, such that there is a set in each bank. The area penalty associated with separate word lines for each bank is very severe because it increases the number of write lines and/or decoder and drivers in the array.

SUMMARY OF THE INVENTION

The present invention addresses the above-described limitation by providing a technique for writing in a banked, multi-ported register file memory array using common write word lines. This technique provides a more efficient way of writing data into a banked, multi-ported memory without increasing penalty due to area in the memory array.

According to another aspect of the present invention, a memory array is provided. The memory array comprises of a common write word line shared by a first memory bank and a second memory bank. The memory array also includes a first write buffer for buffering data to be written to the first memory bank. The memory array includes a second write buffer for buffering data to be written to the second memory bank. The memory array further comprises logic for receiving outputs from both of the first write buffer and second write buffer by writing data only into one of the first or second memory banks.

According to another aspect of the present invention, a memory array is provided. The memory array is comprised of a plurality of memory banks and a common write word line shared by the memory banks. The memory array includes a plurality of write buffers, wherein each write buffer is associated with one of the memory banks. The memory array further comprises a selector module for selecting a write buffer to write data into its associated memory bank. The memory array further includes a writing module within the write buffer for writing data into the selected memory bank by way of a signal to the memory bank.

According to another aspect of the present invention, in a banked memory array having a common write word line shared by the banks of the memory array and write buffers for each of the memory banks, a method for writing data into the banked memory array is provided. The method comprises the step of initializing the memory array to write data into one of a plurality of memory banks by activating the write word line. The method also comprises the step of selecting a write buffer to write data into a memory bank. The method further comprises the step of a writing module within the write buffer for writing data into the selected memory bank by way of a signal to the memory bank.

According to another aspect of the present invention, a memory array is provided. The memory array comprises common write word lines. The memory includes a plurality of memory banks for storing data. The memory array also includes a plurality of write buffers, wherein each of the write buffers are associated with one of the memory banks. The memory array also comprises selector logic for selecting memory banks to write data by way of a set of signals to the memory bank. The memory array further comprises distinguisher logic within the write buffers for sending a different set of signals to one of the memory banks that are not selected by the selector logic to retain data.

BRIEF DESCRIPTION OF THE DRAWINGS

The aforementioned features and advantages, and other features and aspects of the present invention, will become understood with regard to the following description and accompanying drawings wherein.

DETAILED DESCRIPTION

The illustrative embodiment of the present invention employs a multi-port register file for banking multi-ported register file structures with common write word lines.

Figure 1:
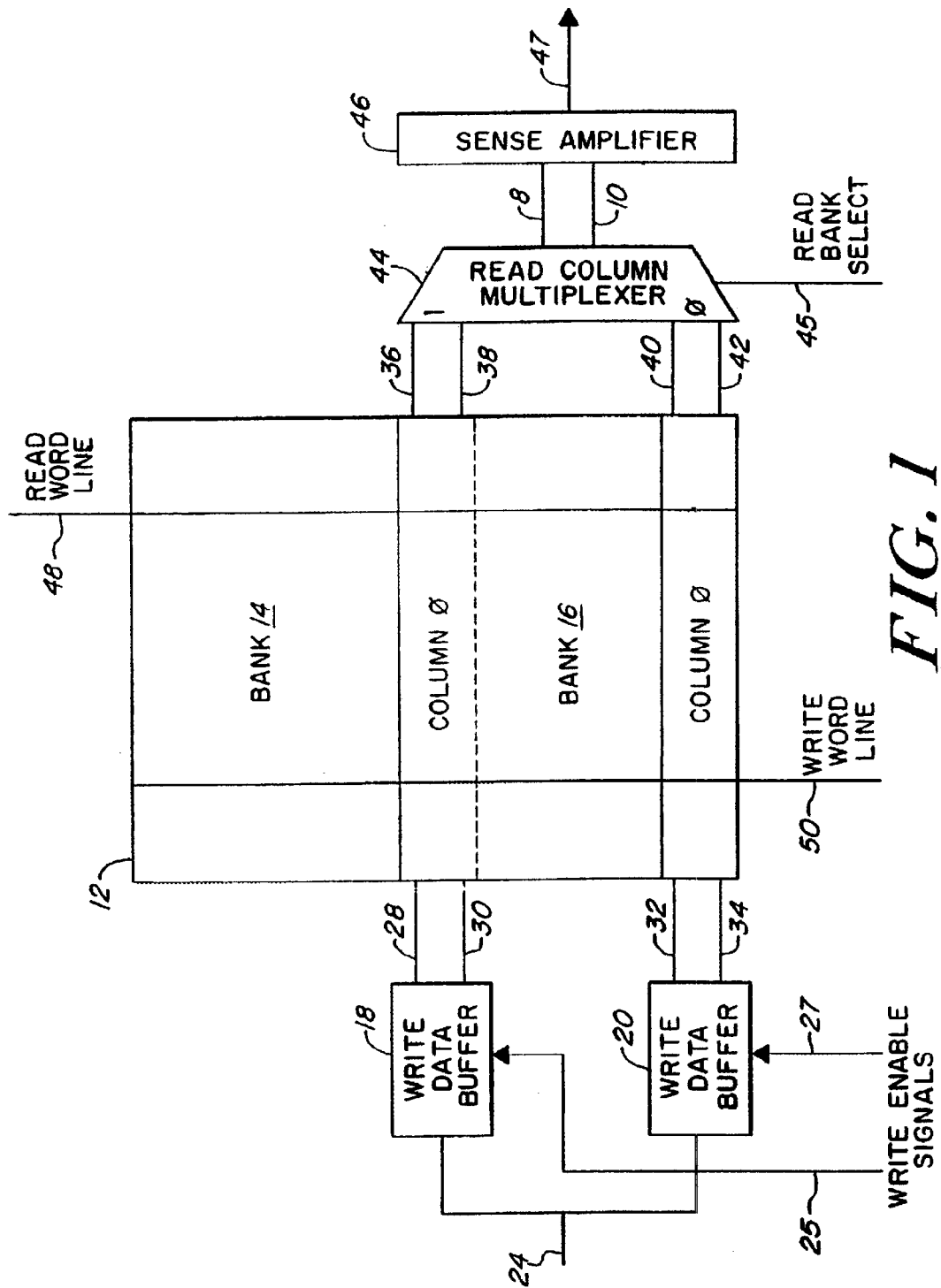
FIG. 1 illustrates a memory array for practicing an illustrative embodiment of the present invention.

FIG. 1 illustrates a memory array 12 that has two memory banks 14 and 16. Each memory bank 14 or 16 includes a plurality of memory cells, organized into rows and columns, that store data bit values. The memory banks 14 and 16 share a common set of write word lines. More specifically, all of the memory cells in a particular row of bank 14 and 16 are driven by the common set of write word lines, one set for each write port that exists in the memory array. One of these write word lines is write word line 50 as illustrated in FIG. 1. The write word line 50 is used to enable data to be written into a particular row of memory cells in either bank 14 or 16. Furthermore, each column of the memory array 12 is connected to a set of complementary write data bit lines 28, 30, 32, and 34, one set for each write port that exists in the memory array 12.

The illustrative embodiment uses two sets of write buffers 18 and 20, one for bank 14 and the other for bank 16. The write data buffers 18 and 20 drives each drive the complementary write data bit lines 28, 30, 32, and 34 that are connected to each memory cell in a particular column of the memory array 12. The write buffers 18 and 20 receive a common write data bit 24 as input, and drive complementary write data bit lines 28, 30, 32, and 34 that are connected to the memory array 12. The write data buffers 18 and 20 also receive write enable signals 25 and 27 respectively as input.

The write enable signals 25 and 27 are used to cause data to be written into a particular bank of data in the memory array 12. For example, if the write enable signal 25 and the write word line 50 are both asserted, write data buffer 18 is enabled, which will cause complementary data to be driven into write data bit lines 28 and 30. The data on the complementary write bit lines 28 and 30 will then be written into the memory cell of column zero of bank 14 that is connected to write word line 50.

On the other hand, if write enable signal 27 is simultaneously deasserted, write data buffer 20 is disabled, which will cause both write data bit lines 32 and 34 to be driven high. Subsequently, the memory cell in column zero of bank 16 that is connected to write word line 50 will not be overwritten with new data because the memory cell is designed to retain data under the condition that both write data bit lines 32 and 34 are driven high. Therefore, this memory cell retains the data that already existed in the cell. If the write data buffer 20 was not disabled in this manner, the same data bit value would be overwritten into both banks 14 and 16.

Reading data values from this banked memory array 12 requires the use of a set of common word lines, one set for each read port that exists in the memory array. One of the read word lines 48 is illustrated in FIG. 1. Furthermore, each column in the memory array 12 is connected to set a set of read data bit lines 36, 38, 40, and 42, one set for each read port that exists in the memory array 12.

When read word line 48 is asserted, each of the memory cells in that row of the memory array 12 drives its corresponding complementary read data bits lines 36, 38, 40, and 42 according to the data currently stored in the memory cell. In the illustrative embodiment, read data bit lines 36, 38, 40, and 42 are driven by a memory cell in column zero of bank 14 and 16 respectively. The read column multiplexer 44 receives the data from the read data bit lines 36, 38, 40, and 42 and allows only one complementary data value to pass to its output 8 and 10 according to the bank select input 45. When the bank select input 45 is asserted high, the data from bank 14 is selected, otherwise bank 16 is selected. The sense amplifier 46 receives the output of the read column multiplexer and produces the appropriate data output value 47.

The use of common write word lines that connect both banks 14 ad 16 in the illustrative embodiment provides a more efficient way to write data into a banked memory array. The area penalty associated with the illustrative embodiment is minimal.

Figure 2:
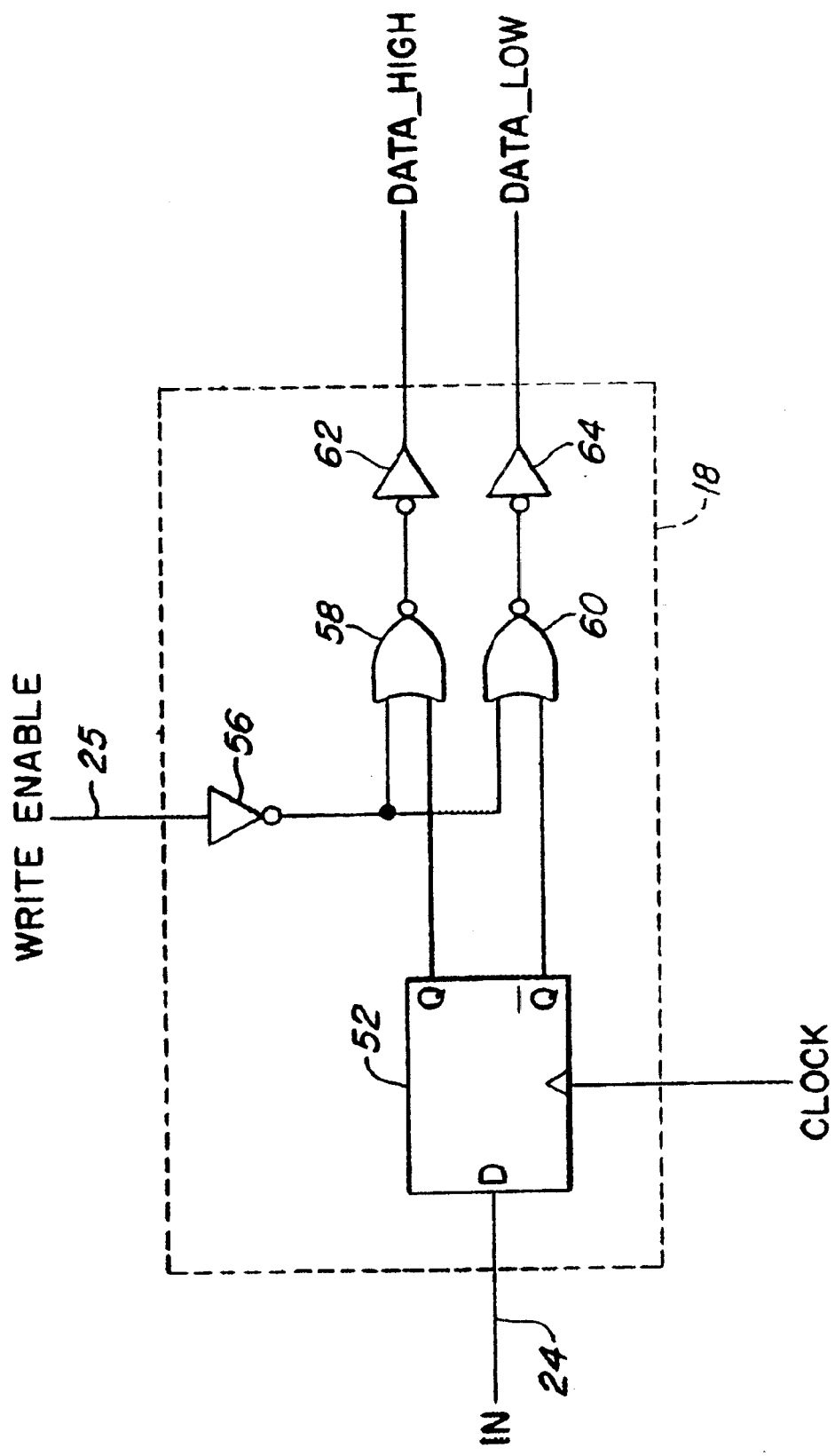
FIG. 2 illustrates write buffers 18 of FIG. 1 in more detail.

FIG. 2 illustrates one of the write buffers 18 in more detail. For illustrative purposes, the write buffer 18 is shown. However, the write buffer 20 includes similar components and functionality as the write buffer 18. The write data buffers 18 and 20 provide the necessary logic needed to drive the differential data into the banked memory array 12. The write data buffer 18 receives a single data bit value as input and stores the data appropriately in a clocked latch 52 with complementary outputs. The latch 52 may be any variety of latches, including level-sensitive, edge-triggered, etc., relative to the clock that controls its timing. The latch 52 outputs are provided as input to NOR gates 58 and 60 respectively. NOR gates 58 and 60 also receive as input the output of inverter 56, which is driven by the write enable signal 25. The outputs of the NOR gates 58 and 60 are sent to inverters 62 and 64 respectively. Note that the output of inverter 62 is the information in the high write data bit line 28, and the output of the inverter 64 is the information in the low write data bit line 30.

For example, if the input data bit 24 is high, the complementary latch outputs a 1 and 0 for the Q and $\overline{Q}$ outputs respectively to the NOR gates 58 and 60. If the write enable signal 25 is high, the output of inverter 56 is low, and output of inverters 62 and 64 is 1 and 0 respectively, which corresponds to a data value of '1' being written into the memory array 12.

However, if write enable signal is low, the output of inverter 56 is high, which forces the outputs of NOR gates 58 and 60 to 0 regardless of the output of the latch 52. Subsequently, the outputs of inverters 62 and 64 are both 1, which prevents data from being written into memory array 12.

Figure 3:
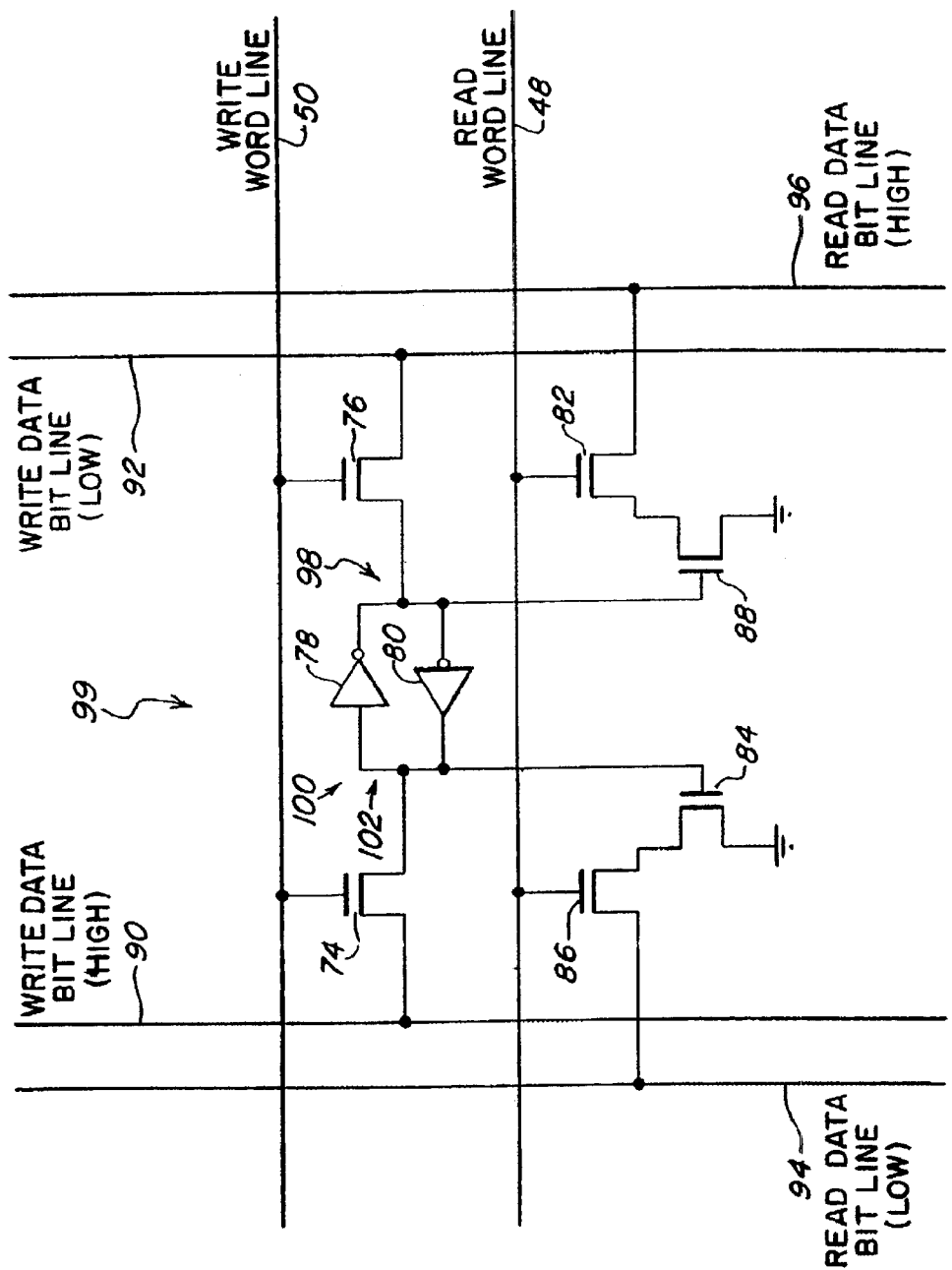
FIG. 3 illustrates a memory cell in more detail.

FIG. 3 illustrates a detailed depiction of a memory cell. The differential data is divided among write data high bit line 90 and write data low bit line 92. For example, differential data "1 1" signifies write data high bit line 90 has a bit value of 1 and the write data low bit line 92 has a value of 1. FIG. 3 illustrates the technique used by the illustrative embodiment to write and read data into a memory cell 98 of bank 14. It should be appreciated that the present invention may include more than one memory cell and include different differential high and low word lines as well as multiple read and write ports. The write high bit line 90 is connected to the source of MOS transistor 74, and the write data low bit line 92 is connected to the source of the MOS transistor 76. The drain of MOS transistor 76 is connected to the right of side 102 of the storage node 100. The drain of MOS transistor 74 is connected to the left side 98 of the storage node 100. The gates of MOS transistors 74 and 76 are connected to the write word line 50. The gate of the grounding MOS transistor 84 is connected to the left side 102 of the storage node 100. The source of MOS transistor 84 is connected to ground. The drain of MOS transistor 84 is connected to the source of the MOS transistor 86. The drain of MOS transistor 86 is connected to the read low bit line 94, and the gate of MOS transistor 86 is connected to the read word line 48. The gate of the grounding MOS transistor 88 is connected to the right side 98 of the storage node 100. The source of the grounding MOS transistor 88 is connected to ground and the drain of the MOS transistor 88 is connected to the source of MOS transistor 82. The gate of MOS transistor 82 is connected to the read word line 48, and the drain of MOS transistor 82 is connected to the read high bit line 96.

If a write operation is requested for memory cell 98, then the write word line 50 is set high. The write MOS transistors 74 and 76 are activated. The differential data bits in the write data high bit line 90 and write data low bit line 92 are "1 0" respectively. As stated in the discussion of FIG. 2, a 1 0 differential data pair designates that a high value is being written. The drain of MOS transistor 74 is set high, and, thus, the left side 102 of the storage node 100 is set high. The drain of MOS transistor 76 is set low and also the right side 98 of the storage node 100 is set low. Thus, the storage node 100 stores a high value.

When the differential data pair has a 0 1, a low value is written into storage node 100. MOS transistors 74 and 76 are activated. The differential data bit pair in the write data high bit line 90 and write data low bit line 92 are 0 1 respectively. As stated in the discussion of FIG. 2, a 0 1 differential data pair designates that a low value is being written. The drain of MOS transistor 74 is set low and thus the left side 102 of the storage node 100 is set low. The drain of MOS transistor 76 is set high and also the right side 98 of the storage node 100 is set high. Thus, the storage node 100 is storing a low value.

When the differential data pair has a 1 1, the data values in memory 98 are retained. The write MOS transistors 74 and 76 are activated. The differential data bit pair in the write data high bit line 90 and write data low bit line 92 are 1 1 respectively. As stated in the discussion of FIG. 2, a 1 1 differential data pair designates that no data value is being written. This is accomplished by ratioing the sizes of the transistors in the memory cell for stability when the write data bit lines 90 and 92 are both similar. Essentially, memory cell 98 is sized to be written only under specific circumstances.

The read bit lines 94 and 96 are pre-charged to a logical high value and the read word line 96 is driven to a logical high value. MOS transistors 74 and 76 are not activated. MOS transistors 82 and 86 are activated. If the storage node 100 is storing a high value, then the right side 98 of the storage node 100 is low and the left side 102 of the storage node 100 is high. The gate of grounding MOS transistor 86 is high to activate MOS transistor 86 and, hence, a low value is present on the read data low bit line 94. The gate of grounding MOS transistor 88 is not activated. As a result, a high value is present at the source of the read MOS transistor 82. Consequently, a high value is present at the read data high bit line 96. The read data high and low bit lines 96 and 94 constitute a 1 and 0 if a high value is read from the storage node 100. As stated above writing a high value requires a 1 0 differential data values, reading differential data of 1 0 from the memory cell 98 constitutes reading a high value.

If the storage node 100 stores a low value, then the left side 102 of the storage node 100 is low and the right side 98 of the storage node 100 is high. The gate of grounding MOS transistor 84 is low. This deactivates MOS transistor 84 and creates a high voltage point at the source of the read MOS transistor 86, resulting in a high value at the read data low bit line 94. The gate of the grounding MOS transistor 88 is activated. This creates a low voltage point at the source of MOS transistor 82. Consequently, setting a low value at the read data high bit line 96. The read data high and low bit lines 96 and 94 constitute a 0 and 1 if a low value is read from the storage node 100.

Numerous modifications and alternative embodiments of the invention will be apparent to those skilled in the art in view of the foregoing description. Accordingly, this description illustrative only and is for the purpose of teaching those skilled in the art the best mode for carrying out the invention. Details of the structure may vary substantially without departing from the spirit of the invention, and exclusive use of all modifications that come within the scope of the appended claims is reserved. It is intended that the invention be limited only to the extent required by the appended claims and the applicable rules of law.

Having described the invention, what is claimed as new and protected by Letters Patent is:

1. A memory array, comprising:
   a common write word line shared by a first memory bank and a second memory bank;
   a first write buffer having a first input to receive a first control signal, a second input to receive a data signal, and two or more outputs for asserting an encoded output signal, the first write buffer encodes the data signal and drives a first bit line and a second bit line of the first memory bank with the encoded signal in response to the first control signal, the first write buffer driving each of the outputs when the first control signal is in a selected state so a selected cell of the first memory bank holding a data value maintains the data value when the first control signal is in the selected state; and
   a second write buffer having a first input to receive a second control signal, a second input to receive a data signal, and two or more outputs for asserting an encoded output signal, the second write buffer encodes the data signal and drives a first bit line and a second bit line of the second memory bank with the encoded signal in response to the second control signal, the second write buffer driving each of the outputs when the second control signal is in a selected state so a selected cell of the second memory bank holding a data value maintains the data value when the second control signal is in the selected state.

2. The memory array as recited in claim 1, wherein the first and second write buffers receive data to be written into a memory cell of the memory array as an additional input.

3. The memory array as recited in claim 2, wherein the write buffers process the data that is received as the additional input and produces at least one complementary signal for writing the data into one of the memory banks.

4. The memory array as recited in claim 3, wherein the complementary signals provided by the write buffers are differential signals.

5. A memory array comprising:
   a plurality of memory banks for storing data;
   a common write word line shared by the memory banks;
   a plurality of write buffers wherein each write buffer is associated with one of the memory banks; and
   a writing module within each of the plurality of write buffers for driving a plurality of bit lines in each of the associated memory banks with a plurality of encoded output signals, at least one of the encoded output signals encoded in a manner to prevent an overwrite of stored data in at least one of the memory banks.

6. The memory device as recited in claim 5, wherein the write buffers receive as input the data to be written into the memory cell of the memory array.

7. The memory device as recited in claim 6, wherein the write buffers process the data received and produce the encoded output signals in part from the data received.

8. The memory device as recited in claim 7, wherein at least one of the encoded output signals is a differential signal.

9. The memory array as recited in claim 5, wherein the write word line asserts which of the banks to write into.

10. In a banked memory array having a common word line shared by the banks of the memory array and write buffers for each of the memory banks, a method for writing data into the banked memory array, said method comprising the steps of:
    initializing the memory array to write data into the memory array by activating the write word line;
    providing each of the write buffers with data;
    selecting one of the write buffers to write data into a selected one of the memory banks;
    encoding the data in each of the write buffers before the selected write buffer writes the data into the selected one of the memory banks, wherein the encoded data in the selected write buffer is in a first state and the encoded data in the other write buffers is in a second state; and
    driving the encoded data into each of the memory banks, wherein the data encoded in the first state over writes data held by the selected memory bank and the data encoded in the second state prevents data held by the other memory banks from being overwritten.

11. The method as recited in claim 10, wherein the write buffers receive as input the data to be written into the selected memory array.

12. A memory array comprising:
   a common write word line;
   a plurality of memory banks for storing data;
   a plurality of write buffers each having an input to receive a control signal, wherein each of the write buffers is associated with one of the memory banks; and
   logic within the write buffers for driving a different set of encoded signals to at least two of the memory banks in response to the control signal, wherein one set of encoded signals driven by the logic within the write buffers indicates a data write in a first of the at least two memory banks and a second set of encoded signals driven by the logic within the write buffers indicates a memory cell in a second of the at least two memory banks should maintain state.

13. The memory device as recited in claim 12, wherein the write buffers receive as input the data to be written into the memory cell of the memory array.

14. The memory device as recited in claim 12, wherein a first set of the encoded signals prevents data from being overwritten in at least one of the memory banks.

* * * * *